United States Patent [19]
Tsutsui et al.

[11] Patent Number: 5,473,616
[45] Date of Patent: Dec. 5, 1995

[54] ADDRESS PATTERN GENERATOR

[75] Inventors: Yasumitsu Tsutsui; Hiroki Takeshita, both of Tokyo, Japan

[73] Assignee: Ando Electric Co., Ltd., Tokyo, Japan

[21] Appl. No.: 26,999

[22] Filed: Mar. 5, 1993

[30] Foreign Application Priority Data

Mar. 31, 1992 [JP] Japan .................................. 4-103989

[51] Int. Cl.⁶ .................................................. G06F 11/00
[52] U.S. Cl. .......................... 371/201; 371/21.1; 371/27
[58] Field of Search .............................. 365/201, 230.01, 365/230.06, 230.08; 371/20.1, 21.1, 27

[56] References Cited

U.S. PATENT DOCUMENTS

| | | | |
|---|---|---|---|
| 3,751,649 | 8/1973 | Hart, Jr. ............................. | 235/153 AC |
| 4,051,460 | 9/1977 | Yamada .................................. | 364/900 |
| 4,293,950 | 10/1981 | Shimizu ..................................... | 371/21 |
| 4,300,234 | 11/1981 | Maruyama ................................. | 371/27 |
| 4,384,348 | 5/1983 | Nozaki ..................................... | 365/201 |

Primary Examiner—Robert W. Beausoliel, Jr.
Assistant Examiner—Glenn Snyder
Attorney, Agent, or Firm—Flynn, Thiel, Boutell & Tanis

[57] ABSTRACT

An address pattern generator for generating regular addresses in a freely set aside area of the memory cell to be tested. The arrangement of the column address generator is structured the same as that of the row address generator wherein both the column address generator and the row address generator receive an add signal from a control circuit, address values from first and second maximum value registers and address values from first and second initial value registers. The column address generator has a comparator which compares an address to be supplied to the memory to be tested with the address value output from the first maximum value register and a selection circuit which selects address to be supplied to the memory using a signal output from the comparator.

8 Claims, 4 Drawing Sheets 5,473,616

ADDRESS PATTERN GENERATOR

BACKGROUND OF THE INVENTION

1. Field of the Invention

The present invention relates to an address pattern generator for testing a memory, etc. which are accessed by two addresses (two-dimensions).

2. Prior Art

An arrangement of a conventional address pattern generator will be described with reference to FIG. 4.

The conventional address pattern generator comprises a control circuit 1, first and second maximum value registers 2 and 3, a column address generator 8, a row address generator 9 and a memory 10 which is to be tested. A column address signal 20 issued by the column address generator 8 is supplied to the memory 10 as a column address. A row address signal 21 issued by the row address generator 9 is supplied to the memory 10 as a row address. A memory cell in the memory 10 is accessed by supplying a column address and a row address to the memory 10.

The arrangement of the memory cells in the memory 10 will be described with reference to FIG. 5. In FIG. 5. the memory cells A0 to A15 are arranged as a matrix. In case of accessing a memory cell A10 of the memory 10, a column address signal 20 representing a column address "010" is supplied from the column address generator 8 to the memory 10 while a row address signal 21 representing a row address "010" is supplied from the row address generator 9 to the memory 10.

The arrangement of the conventional column address generator 8 will be described with reference to FIG. 6. The arrangement of the column address generator 8 is the same as that of the row address generator 9. The column address generator 8 comprises an operation register 8A, an adder 8B and an address register 8G. When a control circuit 1 supplies an add signal 19 to the adder 8B, the adder 8B adds the content of the address register 8G and the content of the operation register 8A. The result of addition is stored in the address register 8G and it is output from the address register 8G as the address signal 20. An address value 17 is the signal output from the first maximum value register 2 which stores therein the maximum value of the address register 8G.

The number of address bits of the memory cell to be tested is generally used as the maximum value. For example, in case of the memory having 64 capacity, 6 bits are used as the address bit wherein 3 bits are used for the row address and 3 bits are used for the column address. Since the address generator has a surplus number of bits compared with the capacity bit of the memory (address bit) to be tested, the number of bits to be used should be limited.

When the memory cells A0 to A15 in FIG. 5 are accessed sequentially, the column address "011" and the row address "011" are respectively stored in the first and second maximum value registers 2 and 3. The column address "000" is stored in the address register 8G of the column address generator 8 as the initial value thereof while the column address "001" is stored in the operation register 8A and thereafter the add signal 19 is supplied to the adder 8B so that the column addresses "000", "001", "010" and "011" are sequentially supplied from the address register 8G to the memory 10 as the column address signal 20. The row address "000" is stored in the address register 9G of the row address generator 9 as the initial value thereof while the column address "000" is stored in the operation register 9A so that the row address "000" is supplied fixedly from the row address register 9G to the memory 10 as the row address signal 21.

The memory cells A0, A1, A2 and A3 are sequentially accessed when the column and row address signals 20 and 21 are supplied to the memory 10. When the memory cells A4 to A15 are sequentially accessed after the accesses of the memory cells A0 to A3, it is necessary that the column address signal 20 should automatically represent the column address "000" and the row address signal 21 should automatically represent the row address "001". If the content of the first maximum value register 2 is supplied to the column address generator 8 and the content of the second maximum value register 3 is supplied to the row address generator 9, an add value 27, which is obtained by carrying out the logical OR between a value representing the content of the operation register 8A and the value to be obtained by inverting the content of the first maximum value register 2, is supplied to the adder 8B wherein the add value 27, the add signal 19 and the output of the address register 8G are added while the upper bits are masked.

If the result of addition in the adder 8B exceeds the content of the first maximum value register 2, a carry is generated to thereby issue a carry signal 22. The carry signal 22 is supplied to the adder 9B of the row address generator 9 whereby the output of the row address generator 9 is rendered to be +1. The masked upper bits can be removed by carrying out the logical AND between an address signal 26, which is the result of operation in the adder 8B, and a value representing the content of the first maximum value register 2. In this case, since the add value 27 of the address becomes "101", if the next add signal 19 is supplied to the adder 8B in case the content of the address register 8G is "011", there is produced "000" as the result of the operation as an address signal 26 and at the same time a carry is generated. As a result, the row address generator 9 carries out an addition in the adder 8B including the carry signal 22 whereby the row address signal 21 is rendered to be +1.

Accordingly, the column address signal 20 is output from the column address register 8 in the order of "000", "001", "010" and "011" and is returned again to "000". The row address signal 21 is increased by +1 starting at the initial-value "000" every time the column address signal 20 returns to "000" again so that the row address signal 21 is output in the order of "001", "010" and "011". With the operations set forth above, the memory cells A0 to A15 can be sequentially accessed when the the address signals 20 and 21 are supplied to the memory 10.

However, it is impossible to specify the test area of the memory by an arbitrary address value since the test area of the memory is specified by limiting the number of bits to be used in the address register 8G in case of generating the regular addresses in the circuits as shown in FIGS. 4 and 6.

SUMMARY OF THE INVENTION

It is therefore an object of the present invention to provide an address pattern generator capable of freely setting the test area of the memory.

To achieve the above object, the address pattern generator of the present invention comprises a column address generator 4, which receives an add signal 19 from a control circuit 1, an address value 17 from a first maximum value register 2 and an address value 33 from a first initial-value register 6, and a row address generator 5, which receives the add signal 19 from the control circuit 1, an address value 18 from a second maximum value register 3 and an address value 34 from a second initial-value register 7, characterized in that the arrangement of the column address generator 4 is the same as that of the row address generator 5 and the column address generator 4 comprises a comparator 4E for comparing an address signal to be supplied to the memory 10 with the address value 2 output from the first maximum value register 2 and a selection circuit 4F for selecting the address signal 20 or 21 to be supplied to the memory 10 using a signal output from the comparator 4E.

DESCRIPTION OF THE PREFERRED EMBODIMENT

Figure 1:
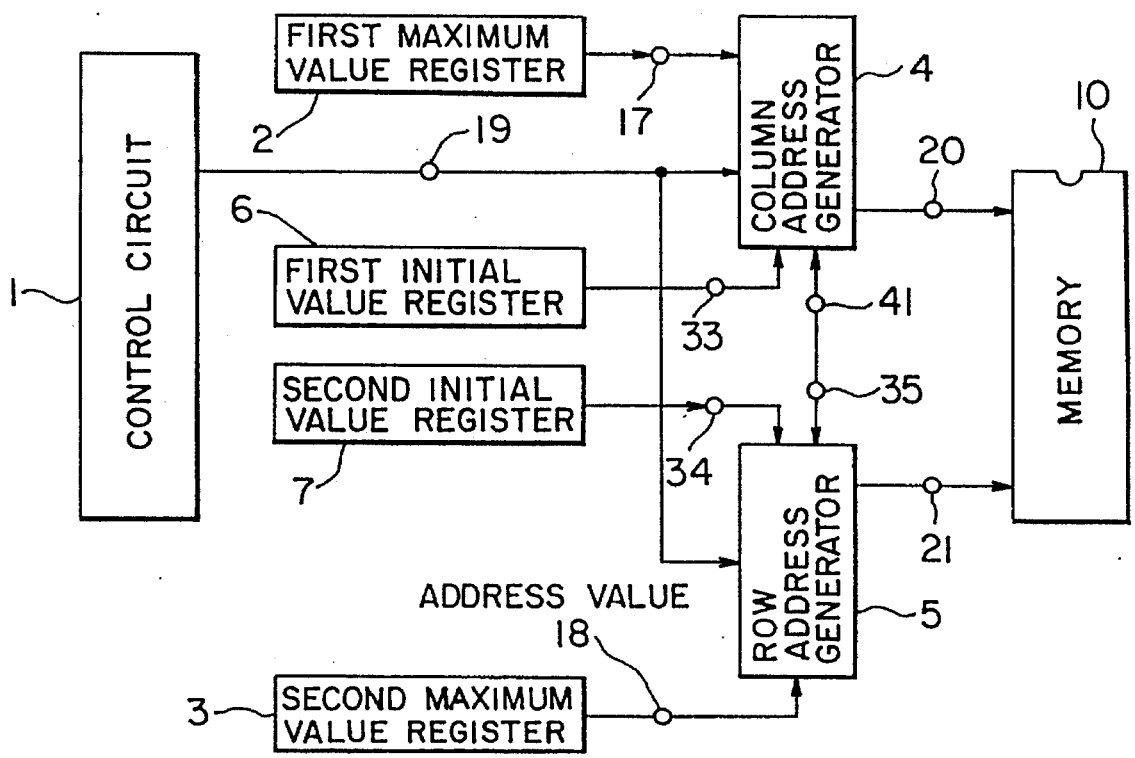
FIG. 1 is a view showing an arrangement of an address pattern generator according to the present invention.
Figure 3:
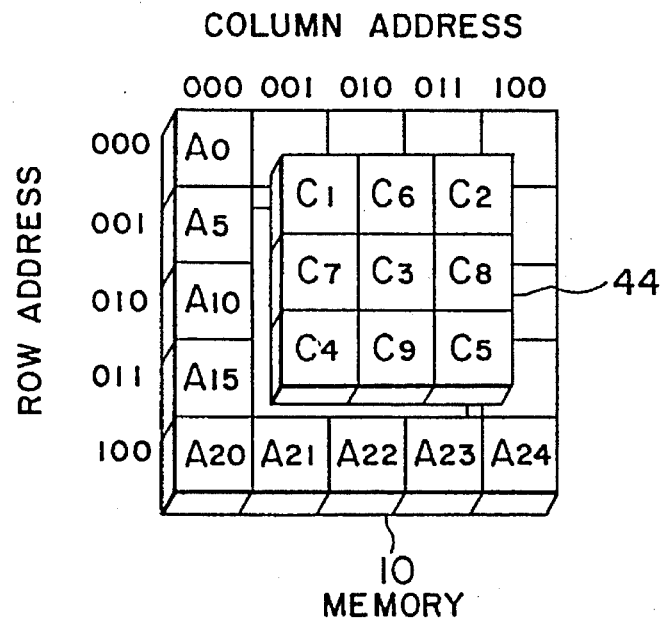
FIG. 3 is a view showing the relation between the memory cells and addresses of a memory 10 in FIG. 1.

The relation between the memory cells and the addresses of the memory 10 in FIG. 1 will be described with reference to FIG. 3. In FIG. 3, the memory 10 comprises memory cells A0 to A24 which are arranged in a 5×5 matrice. An area 44 to be tested is set aside and a memory cell in that area is selectively exemplified. The area 44 has a regular address pattern in which each memory cell C1, C2, C3 . . . C9 is located in row/column positions that alternate or skip column locations in individual rows.

In order to set aside the area of the memory cell to be tested, a "011" is stored in the first and second maximum value registers 2 and 3 and the "011" is stored in the first and second initial value registers 6 and 7. In order to generate the regular addresses as illustrated in FIG. 3, a "010" is stored in the operation register 4A in the column address generator 4 while a "000" is stored in the operation register 5A in the row address generator 5.

The addresses by which memory cell C1 is accessed at the initialization thereof, i.e., a "001" is supplied to the add register 4G of the column address generator 4 and the address register 5G of the row address generator 5. If the add signal 19 is supplied from the control circuit 1 to the column address generator 4, the "001", i.e., the content of the address register 4G and the "010", i.e., the content of the operation register 4A are added in the adder 4B and the "011", i.e., the result of addition is issued from the adder 4B as the output value 40. The comparator 4E compares the "011", i.e., the content of the first maximum value register 2 with the "011", i.e., the output value 40. In this case, the output value 40 is not greater than the content of the first maximum value register 2, the comparison signal 41 is not issued by the comparator 4E.

The selection circuit 4F selects the output value 40 when it does not receive the comparison signal 41 and issues the "011" as the selection value 45 which is supplied to the add register 4G. The address register 46 stores the selection value 45 upon reception thereof and then issues the "011" as the address signal 20. Since the row address generator 5 does not receive the comparison signal 41 as a carry signal 35 from the column address generator 4, the row address generator 5 carries out the operation in the same way as the column address generator 4 whereby the address register 5G issues the "001", i.e., the content of the address register 4G as the row address signal 21 as it is. A memory cell C2 is accessed when the "011" is supplied to the memory 10 as the column address signal 20 and the "001" is supplied to the memory 10 as the row address signal 21.

If the next add signal 19 is supplied to the column address generator 4, the "011", i.e., the content of the address register 4G and "010", i.e., the content of the operation register 4A are added in the adder 4B whereby the adder 4B issues a "101", i.e., the result of addition as the output value 40. The comparator 4E compares the "101" of the output value 40 with the "011", i.e., the content of the first maximum value register 2 and issues the comparison signal 41 since the output value 40 is greater than the value representing the first maximum value register 2.

The selection circuit 4F selects the add value 43 upon reception of the comparison signal 41 and issues the add value 43 as a selection value 45, which is supplied to the address register 4G. The add value 43 is the value obtained by adding, carried out in the adder 4D, the "001", i.e., the output value 42 "001" which is the result of subtraction, carried out in the subtracter 4C, between the "101", i.e., the output value 40 and the "011", i.e., the content of the first maximum value register 2 and the "001", i.e., the first initial-value register 6. The result of the addition becomes the "010". The address register 4G stores the selection value 45 and thereafter issues the "010" as the column address signal 20.

Since the comparison signal 41 is supplied from the column address generator 4 to the row address generator 5 as the carry signal 35, the adder 5B carries out the addition including the +1 carry signal. Successively, the row address generator 5 carries out the operation in the same way as the column address generator 4 and issues the "010" as the column address signal 21. A memory cell C3 is accessed when the "010" is supplied to the memory 10 as the column address signal 20 and the "010" is supplied to the memory 10 as the row address signal 21.

Every time the add signal 19 is supplied to the column address generator 4 and the row address generator 5, the outputs of the address signals 20 and 21 vary so that memory cells C4 and C5 are accessed. Likewise, if memory cells C6 to C9 are accessed by skipping every other cell, the addresses by which the memory cell C6 is accessed at the initial state are supplied to the address register 4G of the column address generator 4 and the address register 5G of the row address generator 5 and thereafter the add signal 19 is supplied to the address register 4G of the column address generator 4 and the address register 5G of the row address generator 5.

The arrangement of the address pattern generator according to the present invention will be described with reference to FIG. 1.

It is possible to regularly generate addresses in circuits within a freely set area of memory cells to be tested according to the present invention, so that a program for controlling the generation of address patterns can be made easily.

Figure 4:
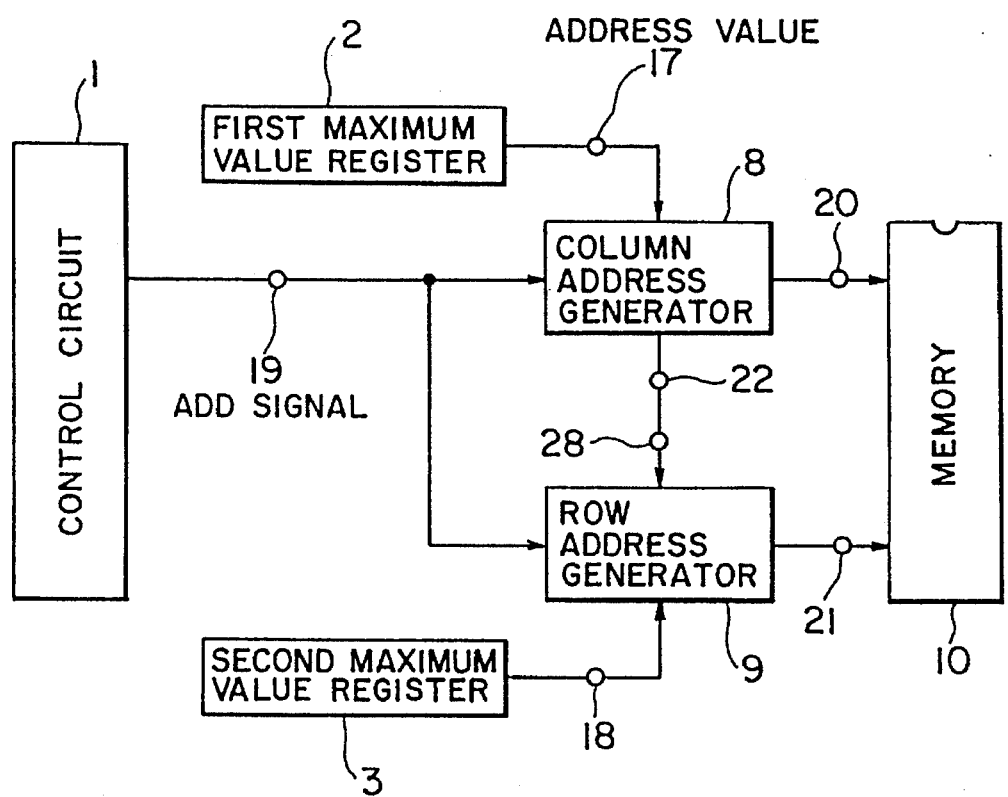
FIG. 4 is a view showing an arrangement of a conventional address pattern generator.
Figure 5:
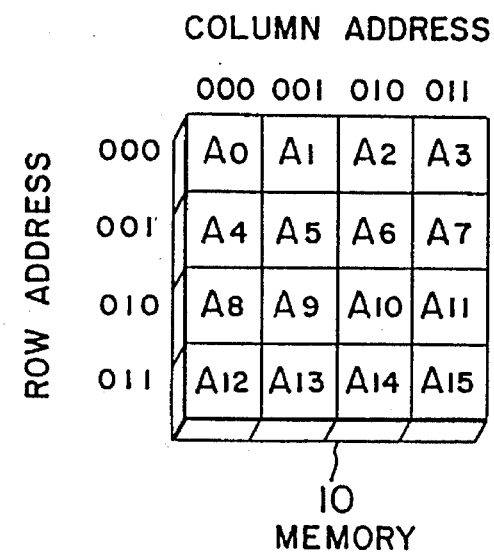
FIG. 5 is a view showing the relation between the memory cells and addresses of a memory 10 in FIG. 4.

The address pattern generator comprises a control circuit 1, first and second maximum value registers 2 and 3, a column address generator 4, a row address generator 5, first and second initial-value registers 6 and 7 and a memory 10 which is to be tested. The arrangement of the present invention as illustrated in FIG. 1 is different from the conventional arrangement as illustrated in FIG. FIG. 4 in respect that the former has the first and second initial-value registers 6 and 7 in addition to the arrangement of the latter. The first and second initial-value registers 6 and 7 store therein the minimum values of the addresses by which the memory cell of the test area is accessed. The test area of the memory cell is set when the contents of the maximum value registers 2 and 3 and the contents of the initial-value registers 6 and 7 are supplied to the column address generator 4 and the row address generator 5.

Figure 2:
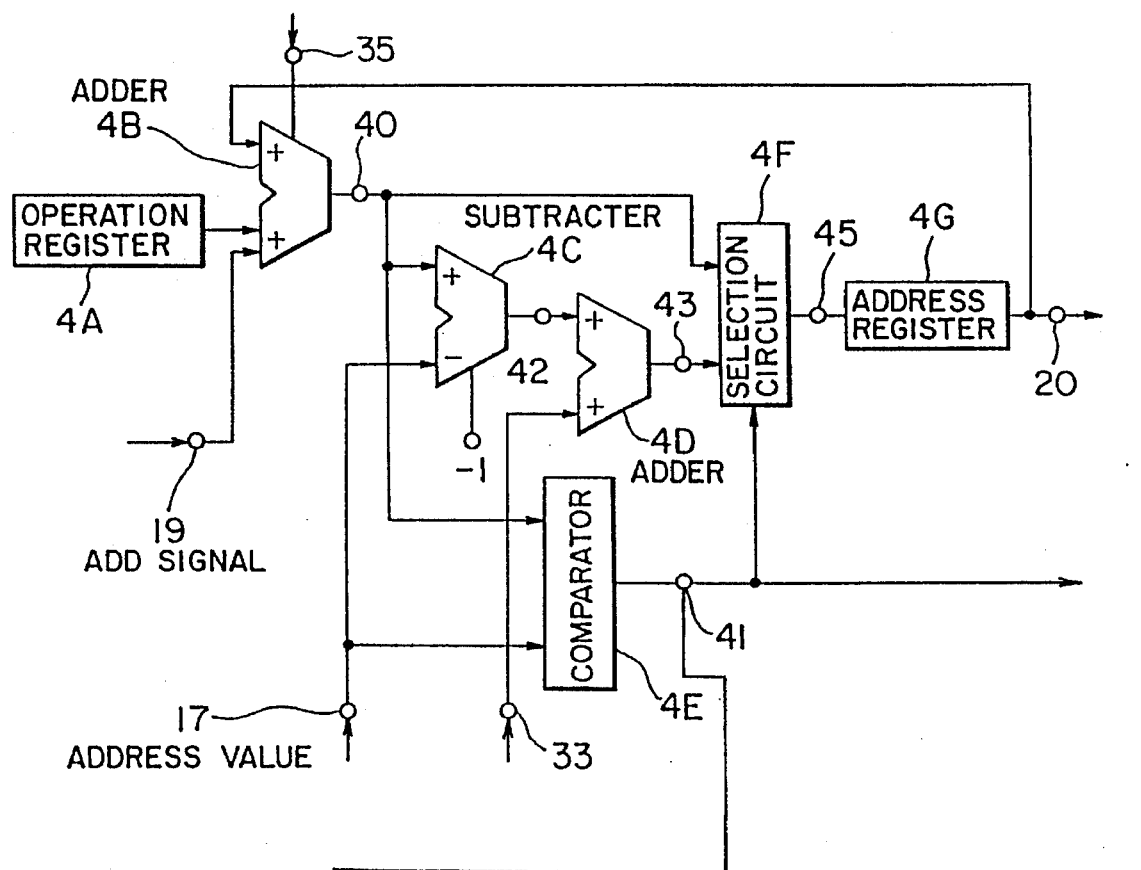
FIG. 2 is a view showing an arrangement of a column address generator in FIG. 1.
Figure 2:
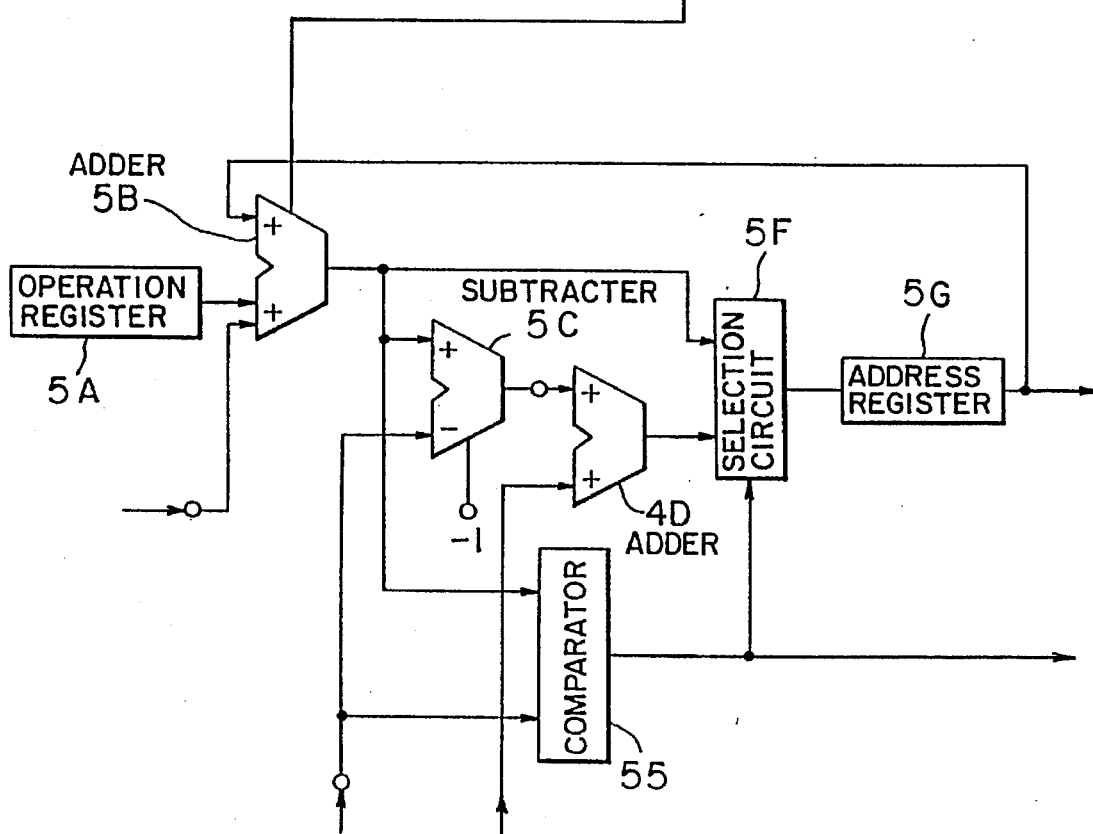
Figure 6:
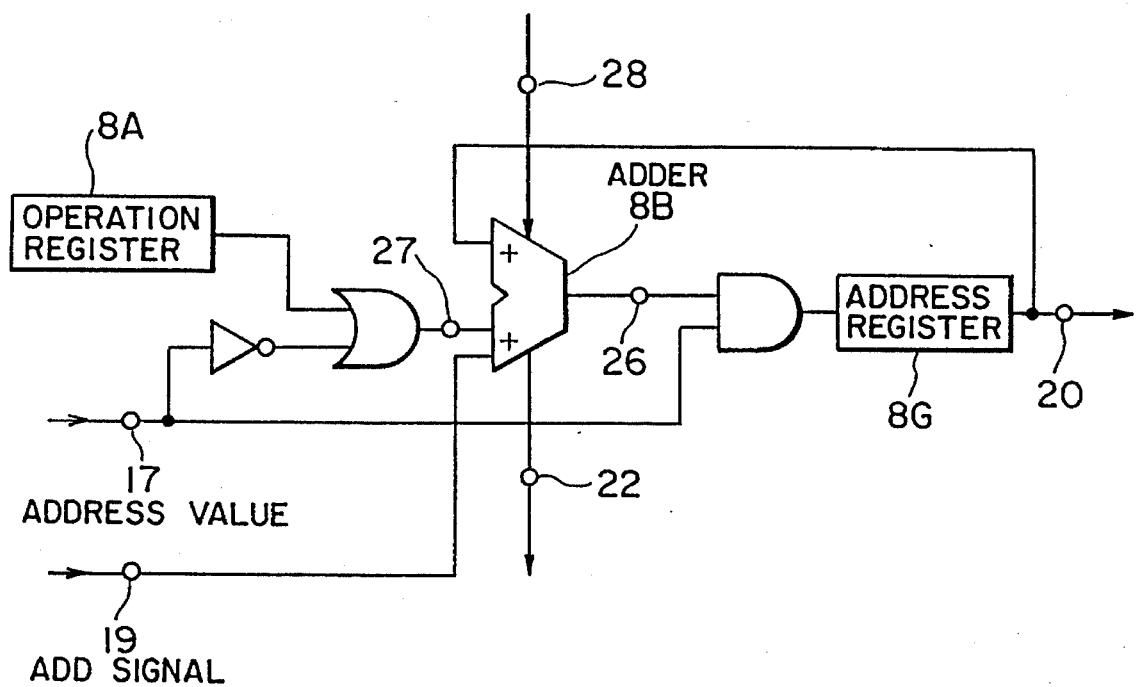
FIG. 6 is a view showing an arrangement of a column address pattern generator 8 in FIG. 4.

The arrangement of the column address generator 4 will be described with reference to FIG. 2. The arrangement of the column address generator is the same as that of the row address generator. The operation register 4A, the adder 4B and the address register 4G in FIG. 2 are the same as the operation register 8A, the adder 8B and the address register 8G in FIG. 6. The arrangement of the present invention has a subtracter 4C, an adder 4D, a comparator 4E and a selection circuit 4F in addition to the arrangement of the prior art in FIG. 6.

If the add signal 19 is supplied from the control circuit 1 to the adder 4B, the content of the address register 4G and the content of the operation register 4A are added in the adder 4B. The result of addition is supplied as an output value 40 from the adder 4B to the subtracter 4C, the comparator 4E and the selection circuit 4F. The subtracter 4C carries out subtraction between the output value 40 and the address value 17 so that the difference therebetween can be obtained. Accordingly, the subtracter 4C receives a borrow signal so that +1 is subtracted extra.

The result of subtraction is supplied as an output value 42 to the adder 4D so that the adder 4D adds the output value 42 and an address value 33 which is the content of the first initial-value register 6 whereby the result of addition is supplied as an add value 43 to the selection circuit 4F. The comparator 4E compares the output value 40 with the address value 17. If the output value 40 is greater than the address value 17, the comparator 4E supplies a comparison signal 41 to the selection circuit 4F and the row address generator 5 while if the output value 40 is less than the address value 17, the comparator 4E does not issue the comparison signal 41.

If the comparison signal 40 is supplied from the comparator 4E to the selection circuit 4F, i.e., if the output value 40 is greater than the address value 17, the selection circuit 4F selects the add value 43. If the comparison signal 40 is not issued from the comparator circuit 4E, i.e., if the output value 40 is the same as or less than the address value 17, the selection circuit 4F selects the output value 40 and issues a selection value 45 which is supplied to the address register 4G. The address signal 4G stores the selection value 45, upon reception thereof from the selection circuit 4F, and thereafter outputs the same as an address signal 20.

In the row address generator 5, if the comparison signal 41 from the column address generator 4 is supplied to the adder 5B as a carry signal 35, the adder 5B receives the signal as a carry of +1 and carries out the addition. The row address generator 5 carries out the operation in the same way as the column address generator 4 so that the address signal 21 is output from the address register 5G.

Every time the add signal 19 is supplied to the column address generator 4 and the row address generator 5, the column address generator 4 and the row address generator 5 issues regularly the address signals 20 and 21 by which the memory cell in a given area of the memory 10 can be accessed.

What is claimed is:

1. An address pattern generator for a digital data processing system memory having memory elements addressable by column and row locations, said generator including:

a column address generator including:
(a) an initial value register for storing an indication of a lowest column location in which data are stored;
(b) a maximum value register for storing an indication of a highest column location in which data are stored;
(c) an address register for storing a column address location;
(d) a first add circuit connected to said address register for receiving said stored column address therefrom, said first add circuit producing a first incremented column address from said stored column address;
(e) a second add circuit connected to said first add circuit for receiving said first incremented column address therefrom and to said initial value register for receiving said indication of said lowest column location, said second add circuit producing a second incremented column address from said first incremented column address and said lowest column location;
(f) a comparator connected to said first add circuit for receiving said first incremented column address and to said maximum value register for receiving said value representative of said highest column location, said comparator being configured to assert a first comparison signal when said first incremented column address is greater than the highest column location; and
(g) a selector connected to said first add circuit for receiving said first incremented column address therefrom, to said second add circuit for receiving said second incremented column address therefrom, to said column address generator comparator for receiving said first comparison signal therefrom and to said address register for forwarding one of said incremented column addresses thereto, said selector forwarding either said first or second incremented column address to said address register depending on the state of said first comparison signal; and a row address generator including:
(a) an initial value register for storing an indication of a lowest row location in which data are stored;
(b) a maximum value register for storing an indication of a highest row location in which data are stored;
(c) an address register for storing a row address location;
(d) a first add circuit connected to said row address generator address register for receiving said stored row address therefrom, said first add circuit producing a first incremented row address from said stored row address;
(e) a second add circuit connected to said row address generator first add circuit for receiving said first incremented row address therefrom and to said initial value register for receiving said indication of said lowest row location, said second add circuit producing a second incremented row address from said first incremented row address and said lowest row location;
(f) a comparator connected to said row address generator first add circuit for receiving said first incremented row address and to said row address generator maximum value register for receiving said value representative of said highest row location, said comparator being configured to assert a second comparison signal when said first incremented row address is greater than the highest row location; and (g) a selector connected to said row address generator first add circuit for receiving said first incremented row address therefrom, to said row address generator second add circuit for receiving said second incremented row address therefrom, to said row address generator comparator for receiving said second comparison signal therefrom and to said address register for forwarding one of said incremented row addresses thereto, said selector forwarding either said first or second incremented row address to said row address generator address register depending on the state of said second comparison signal.

2. The address pattern generator of claim 1, wherein said row address generator first add circuit includes an adder configured to receive a carry-in addend and said first comparison signal from said column address generator comparator is applied to said row address generator first add circuit to function as said carry-in addend.

3. The address pattern generator of claim 1 wherein:

said column address generator selector forwards said first incremented column address to said column address generator address register when said first comparator signal is not asserted and forwards said second incremented column address to said column address generator address register when said first comparator signal is asserted; and said row address generator selector forwards said first incremented row address to said row address generator address register when said second comparator signal is not asserted and forwards said second incremented row address to said row address generator address register when said second comparator signal is asserted.

4. The address pattern generator of claim 3, wherein:

said column address generator second add circuit includes a subtracter and an adder, said subtracter being connected to receive said first incremented column address from said first add circuit and to receive said highest column location from said maximum value register so as to produce an intermediate value representative of the difference between said first incremented column address and said highest column location and said adder is configured to receive said intermediate value from said subtracter and said lowest column location from said initial value register as addends and produces said second incremented column address therefrom; and said row address generator second add circuit includes a subtracter and an adder, said subtracter being connected to receive said first incremented row address from said first add circuit and to receive said highest row location from said maximum value register so as to produce an intermediate value representative of the difference between said first incremented row address and said highest row location and said adder is configured to receive said intermediate value from said subtracter and said lowest row location from said initial value register as addends and produces said second incremented row address therefrom.

5. The address pattern generator of claim 3, wherein said row address generator first add circuit adder is configured to receive a carry-in addend and said first comparison signal from said column address generates is applied to said row address generator first add circuit to function as said carry-in addend.

6. The address pattern generator of claim 3, wherein:

said column address generator first add circuit includes an operation register and an adder, said operation register storing a column increment value, and said adder is connected to receive said column address from said address register and said column increment value from said operation register as addends and produces said first incremented column address therefrom; and said row address generator first add circuit includes an operation register and an adder, said operation register storing a row increment value, and said adder is connected to receive said row address from said address register and said row increment value from said operation register as addends and produces said first incremented row address therefrom.

7. The address pattern generator of claim 6, wherein:

said column address generator second add circuit includes a subtracter and an adder, said subtracter being connected to receive said first incremented column address from said first add circuit and to receive said highest column location from said maximum value register so as to produce an intermediate value representative of the difference between said first incremented column address and said highest column location and said adder is configured to receive said intermediate value from said subtracter and said lowest column location from said initial value register as addends and produces said second incremented column address therefrom; and said row address generator second add circuit includes a subtracter and an adder, said subtracter being connected to receive said first incremented row address from said first add circuit and to receive said highest row location from said maximum value register so as to produce an intermediate value representative of the difference between said first incremented row address and said highest row location and said adder is configured to receive said intermediate value from said subtracter and said lowest row location from said initial value register as addends and produces said second incremented row address therefrom.

8. The address pattern generator of claim 7, wherein said row address generator first add circuit includes an adder configured to receive a carry-in addend and said first comparison signal from said column address generator is applied to said row address generator first add circuit to function as said carry-in addend.

\* \* \* \* \*

UNITED STATES PATENT AND TRADEMARK OFFICE
CERTIFICATE OF CORRECTION

PATENT NO. : 5,473,616
DATED : December 5, 1995
INVENTOR(S) : Yasumitsu TSUTSUI, et al It is certified that error appears in the above-indentified patent and that said Letters Patent is hereby corrected as shown below:

Column 8, line 9; change "generates" to
---generator---.

Signed and Sealed this

Fourteenth Day of May, 1996

Attest:

BRUCE LEHMAN

Attesting Officer         Commissioner of Patents and Trademarks